United States Patent
Kim

(10) Patent No.: US 8,836,401 B2
(45) Date of Patent: Sep. 16, 2014

(54) I/O DATA RETENTION DEVICE

(71) Applicant: Samsung Electronics Co., Ltd., Suwon-si (KR)

(72) Inventor: Eonguk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/755,521

(22) Filed: Jan. 31, 2013

(65) Prior Publication Data

US 2013/0335127 A1    Dec. 19, 2013

(30) Foreign Application Priority Data

Jun. 13, 2012 (KR) .................. 10-2012-0063078

(51) Int. Cl.
*H03K 3/356* (2006.01)
*H03K 3/012* (2006.01)

(52) U.S. Cl.
CPC .......... *H03K 3/012* (2013.01); *H03K 3/356008* (2013.01)
USPC .......................................................... 327/208

(58) Field of Classification Search
CPC ............................ H03K 3/012; H03K 3/0375
USPC .......... 327/199–201, 208–210, 214, 544–546
See application file for complete search history.

(56) References Cited

U.S. PATENT DOCUMENTS

| | | | |
|---|---|---|---|
| 5,757,702 A | 5/1998 | Iwata et al. | |
| 6,556,071 B2 | 4/2003 | Notani et al. | |
| 6,597,620 B1 | 7/2003 | McMinn | |
| 6,836,175 B2 | 12/2004 | Morikawa | |
| 7,164,301 B2 * | 1/2007 | Chun | 327/202 |
| 7,436,206 B2 | 10/2008 | Kurotsu | |
| 7,589,564 B2 | 9/2009 | Simmons et al. | |
| 7,598,791 B2 | 10/2009 | Oikawa | |
| 7,839,016 B2 | 11/2010 | Wang et al. | |
| 2003/0062948 A1 | 4/2003 | Notani et al. | |
| 2004/0108884 A1 | 6/2004 | Morikawa | |
| 2006/0261859 A1 | 11/2006 | Kawano | |
| 2007/0120577 A1 | 5/2007 | Oikawa | |
| 2008/0094889 A1 | 4/2008 | Kurotsu | |
| 2008/0136451 A1 | 6/2008 | Simmons et al. | |
| 2009/0153210 A1 | 6/2009 | Wang et al. | |

FOREIGN PATENT DOCUMENTS

JP    3896957 B2    3/2007
KR    20110078372 A    7/2011

* cited by examiner

*Primary Examiner* — Lincoln Donovan
*Assistant Examiner* — Sibin Chen
(74) *Attorney, Agent, or Firm* — Harness, Dickey & Pierce

(57) ABSTRACT

An apparatus for controlling retention of data includes a logic circuit, a retention control cell circuit, and an I/O cell circuit. The logic circuit generates at least one retention enable signal before a chip enters a reduced power mode. The retention control cell circuit latches the retention enable signal and outputs a retention enable control signal based on a first power signal of the logic circuit and a detection result of a second power signal for input/output (I/O). And, the I/O cell circuit latches data based on the retention control signal.

11 Claims, 7 Drawing Sheets

I/O DATA RETENTION DEVICE

CROSS-REFERENCE TO RELATED APPLICATIONS

This U.S. non-provisional patent application claims priority under 35 U.S.C. §119 of Korean Patent Application No. 10-2012-0063078, filed on Jun. 13, 2012, the entire contents of which are hereby incorporated by reference.

BACKGROUND

1. Field

One or more embodiments described herein relate to a data storage circuit.

2. Background

Many electronic devices are controlled to enter a reduced power mode when, for example, there has been a period of inactivity. These modes not only prolong battery life, they also allow power to be used more effectively. For example, in a low power mode (e.g., power-down or idle mode), battery voltage may be diverted to maintain operation of only a few core functions of the device.

In mobile and other applications, a controller may adjust a logic circuit to operate in a low power mode. In this mode, external signals are required to be generated in order to retain storage of data at I/O pads and/or other locations in a circuit. The need to receive external (e.g., off-chip) signals for data retention adds to the number of control pins required for the device and also reduces power control efficiency and serves to deplete battery life. Even in applications where external signals are not generated on chip, improvements are still required for performing I/O data retention operation.

SUMMARY

In accordance with one embodiment, a data retention device includes a logic circuit configured to generate at least one retention enable signal before a chip enters a reduced power mode, a retention control cell circuit configured to latch the retention enable signal and to output a retention enable control signal based on a first power signal of the logic circuit and a detection result of a second power signal for input/output (I/O), and an I/O cell circuit configured to latch data based on the retention control signal.

The retention control cell circuit may include a latch configured to perform a latch operation based on the retention enable signal and to output the retention enable control signal of a first level when a retention control operation is performed, a detector configured to generate a first detection signal for the first power signal of the logic circuit and a second detection signal for the second power signal for I/O, a controller configured to control the latch unit based on the first detection signal and the second detection signal, and an initializer configured to set the retention enable control signal to disable a retention operation of the I/O cell circuit during a power-on mode of the chip based on the second detection signal.

The latch may include first and second transistors of a first conductivity type and first and second transistors of a second conductivity type forming an inverter-type latch, and third and fourth transistors of the second conductivity type respectively coupled to an input terminal and an output terminal of the inverter-type latch to receive the retention enable signal and a complementary retention enable signal.

The latch may also include gating logic configured to perform a logic operation based on logical values of the first and second detection signals, a fifth transistor of the second conductivity type coupled between the input terminal of the inverter-type latch and a drain of the third transistor of the second conductivity type, the fifth transistor configured to perform a switching operation based on at least one of the retention enable signals in response to the gating logic, and a sixth transistor of the second conductivity type coupled between the output terminal of the inverter-type latch and a drain of the fourth transistor of the second conductivity type, the sixth transistor configure to perform a switching operation based on at least one of the retention enable signals in response to an output of the gating logic.

The initializer may include a transistor of a first conductivity type configured to generate the retention enable control signal to maintain the I/O cell circuit in a disabled state during the power-on mode of the chip based on at least the second detection signal.

The detector may include a first detector circuit configured to generate the first detection signal based on a level of the first power signal; and a second detector circuit configured to generate the second detection signal based on a level of the second power signal.

The second detector may include a transistor of a first conductivity type having first, second and third terminals, the first terminal configured to receive the second power signal and the second terminal configured to receive a reference voltage; a resistor coupled between the third terminal of the transistor of the first conductivity type and a ground; a first inverter configured to invert an output level of the third terminal; and a second inverter configured to invert an output of the first inverter.

The first detector circuit may include a resistor having a first end coupled to receive the second power signal, a transistor having a drain-source channel coupled between a second end of the resistor and ground, the transistor having a control terminal configured to receive the first power signal, and an inverter to invert an output level of another terminal of the transistor. The logic circuit may correspond to a mobile application device such as a smart phone.

The first power signal may lie in a range between a reference voltage and substantially 1.8V, and the second power signal may lie in a range between a reference voltage and substantially 3.3V.

In accordance with another embodiment, a retention control cell circuit includes a latch configured to receive a retention enable signal from a logic circuit and to output a retention enable control signal based on the retention enable signal, a detector configured to generate a first detection signal based on a level of a first power signal for the logic circuit and to generate a second detection signal based on a level a second power signal for an I/O circuit, a controller configured to control the latch based on the first detection signal and the second detection signal, and an initializer configure to set the retention enable control signal to disable a data retention operation of the I/O circuit based on the second detection signal.

The latch may include an inverter-type latch circuit and first transistors respectively coupled to an input terminal and an output terminal of the inverter-type latch circuit, the first transistors configured to receive the retention enable signal and complementary retention enable signal. The latch may include gating logic configured to perform a logical operation based on logic states of the first detection signal and the second detection signal, at least a second transistor coupled between an input terminal of the inverter-type latch and one of the first transistors, the second transistor configured to pass the retention enable signal based on an output of the gating logic, and at least a third transistor coupled between an output terminal of the inverter-type latch and another one of the first transistors, the third transistor configured to pass the retention enable signal based on the output of the gating logic.

In accordance with another embodiment, an apparatus for controlling retention of data includes a first detector configured to detect a first power signal, a second detector configured to detect a second power signal, and a controller configured to generate a control signal for a data retention circuit, the first power signal to power a first circuit and the second power signal to power an input/output circuit, the control signal to enable the data retention circuit to retain data in a first power mode when a signal from the first detector has a first level and a signal from the second detector has a second level different from the first level.

The controller may include a first latch coupled between the first and second detectors and a latch controller configured to control the first latch. The control signal may be generated by the first latch in a second power mode to disable the data retention circuit, and the control signal may enable the data retention circuit in the first power mode to retain the data at a time when at least one terminal of the latch controller is in a floating state.

The latch controller may include a first terminal coupled to the first detector and a second terminal coupled to the second detector. The control signal may enable the data retention circuit in the first power mode to retain said data when the first and second terminals of the latch controller are in floating states. The control signal may disable the data retention circuit is a second power mode different from the first power mode. The first power mode may be a reduced power mode.

DETAILED DESCRIPTION

Figure 1:
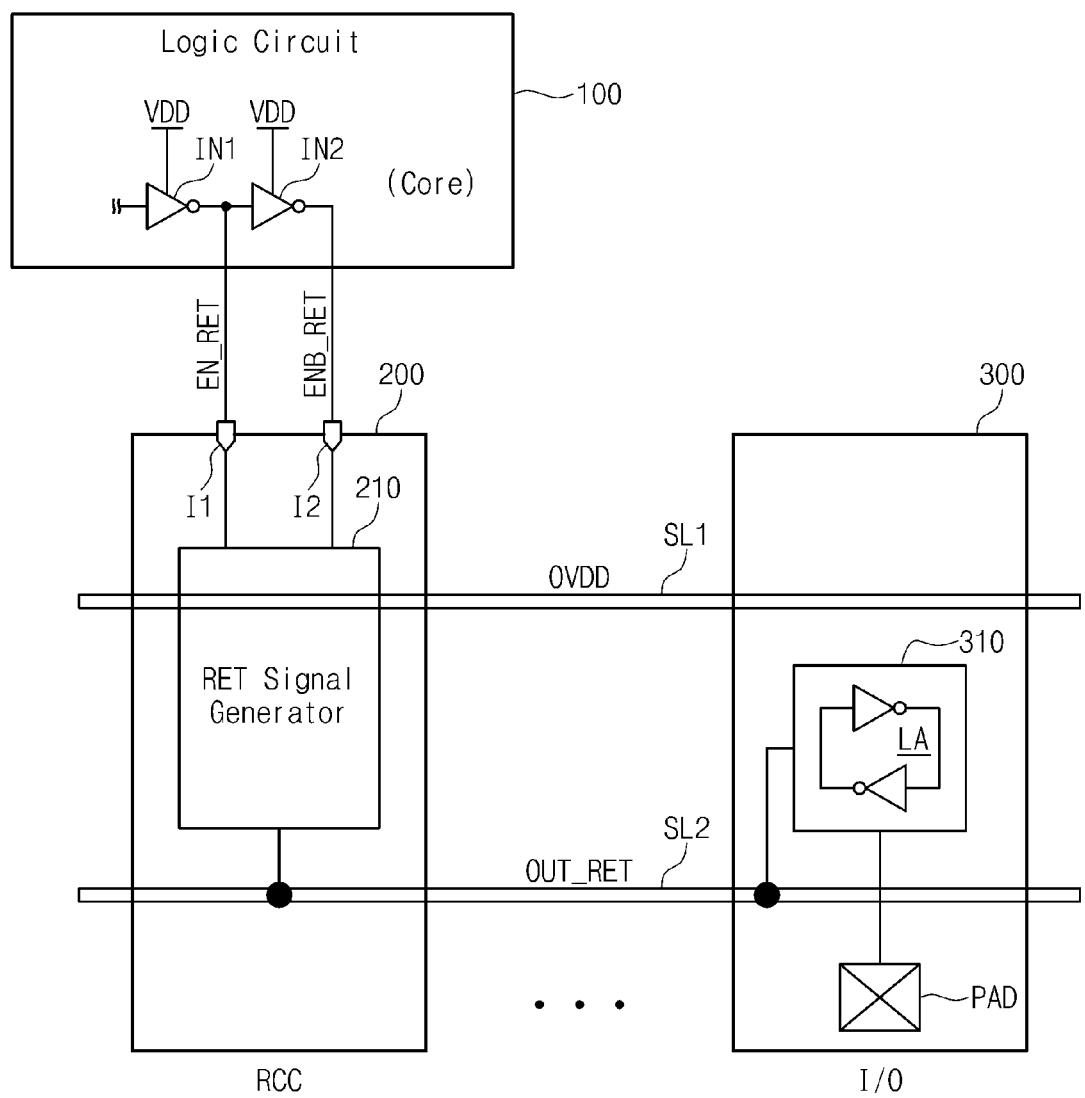
FIG. 1 shows one embodiment of an I/O data retention device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (eg., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 shows one embodiment of an input/output (I/O) data retention device which includes a logic circuit 100, a retention control cell (RCC) circuit 200, and an I/O cell circuit 300. In the logic circuit 100, power supply voltage VDD is cut off or reduced in a low power mode and therefore a data retention operation may be performed. The low power mode may be a power-down mode, idle mode, sleep mode, hibernate mode, or another type of low power mode, and the host device may be a mobile device, a stationary device, or even a system that performs a data retention function.

The logic circuit 100 may perform a variety of functions including but not limited to generating retention enable signals EN_RET and ENB_RET before entering the lower power mode.

The retention control cell circuit 200 may latch the retention enable signals EN_RET and ENB_RET based on a detection result of a power supply voltage monitored by the logic circuit and a power supply voltage for performing an I/O function. Based on these signals, a retention control signal OUT_RET may be generated. The I/O cell circuit 300 latches I/O data in response to the retention control signal OUT_RET.

According to one embodiment, an inverter IN1 in logic circuit 100 outputs the retention enable signal EN_RET before entering the low power mode. An inverter IN2 outputs the retention enable bar signal ENB_RET, which is a complementary signal of the retention enable signal EN_RET. When the logic circuit 100 enters the low power mode, the power supply voltage VDD is reduced or cut off in logic circuit 100.

The retention control cell circuit 200 receives the retention enable signal EN_RET through an input terminal 11 and the retention enable bar signal ENB_RET through an input terminal 12.

The retention control cell circuit 200 may include a retention signal generator 210 to receive a number of signals. In this embodiment, retention control cell circuit 200 receives a power supply voltage signal applied to an I/O circuit through a line SL1. This power supply voltage signal may be referred to as a high voltage OVDD at, for example, 3.3V. In addition, the retention control cell circuit receives retention enable signals EN_RET and ENB_RET based on a detection result of the power supply voltage VDD for or from the logic circuit and a the power supply voltage OVDD for I/O. Based on these signals, the retention control signal OUT_RET is output through a line SL2.

The I/O cell circuit 300 receives the retention control signal OUT_RET as a latch control signal. A latch 310 (constituted by inverter latch circuit LA, which may operate as a keeper circuit) is controlled according to a state of the retention control signal OUT_RET. For example, latch 310 may be enabled to latch I/O data when the retention control signal OUT_RET has a low level and may be disabled when the retention control signal OUT_RET has a high level. As a result of the data retention operation, I/O data latched before the low power mode appears in an I/O PAD. In accordance with one embodiment, an output state of the I/O PAD may be equal to a logical state of data latched in a state of before power of the logic circuit is reduced or turned off.

Figure 2:
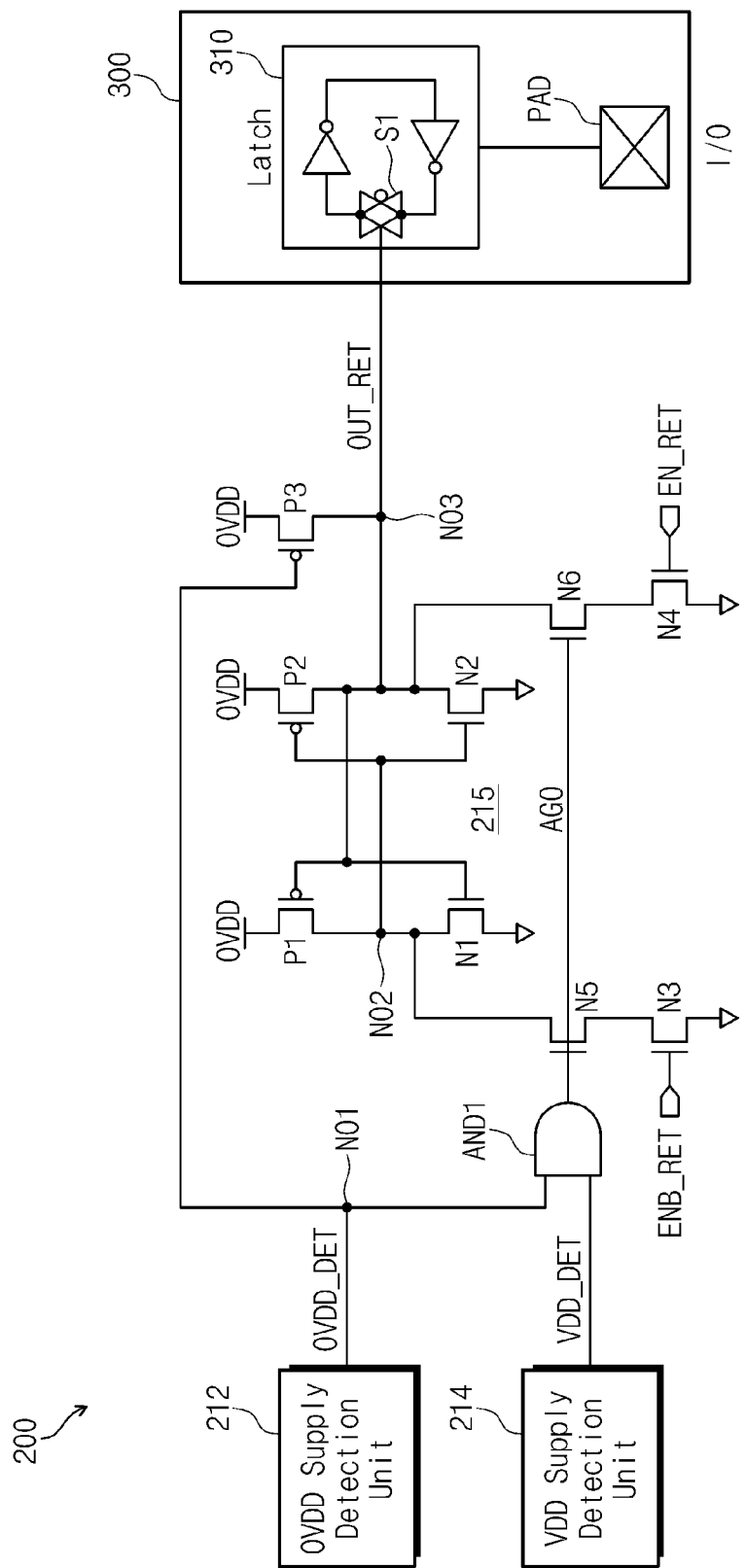
FIG. 2 shows an example of a retention control cell circuit of FIG. 1.

FIG. 2 shows one example of retention control cell circuit 200 in FIG. 1. As shown, this example of the retention control cell circuit includes a latch circuit 215, power supply detectors 212 and 214, a latch controller (including AND1, N5, N6), and an initialization circuit P3.

The latch circuit and latch controller may correspond to the retention signal generator 210 of FIG. 1. In operation, latch circuit 215 performs a latch operation in response to the retention enable signals EN_RET and ENB_RET and outputs the retention control signal OUT_RET based on a level of the I/O power supply signal OVDD through the latch output terminal NO3 when performing a retention control operation.

In this example embodiment, the latch circuit 215 includes first and second PMOS transistors P1 and P2, first and second NMOS transistors N1 and N2, and third and fourth NMOS transistors N3 and N4 which are coupled to input terminals NO2 and NO3 of the inverter-type latch, respectively, to receive the retention enable signals EN_RET and ENB_RET that are complementary to each other.

The voltage supply detectors 212 and 214 respectively generate a high voltage detection signal OVDD_DET detecting the supply of high voltage for the I/O circuit and a power supply voltage detection signal VDD_DET detecting the supply of power supply voltage for the logic circuit and/or a host device. The latch controller controls latch circuit 215 based on the power supply voltage detection signal VDD_DET and the high voltage detection signal OVDD_DET.

The latch controller may include a gating unit, an NMOS transistor N5, and an NMOS transistor N6. The gating unit includes a logical gate (e.g., AND1) gating a logical state of the power supply voltage detection signal and a logical state of the high voltage detection signal. NMOS transistor N5 is connected between input terminal NO2 of inverter-type latch and a drain of the NMOS transistor N3 and switches the retention enable signal ENB_RET in response to an output of the gating unit. NMOS transistor N6 is connected between input terminal NO3 of the inverter-type latch and a drain of the NMOS transistor N4 and switches the retention enable signal EN_RET in response to an output of the gating unit.

The initialization unit P3 sets the retention control signal OUT_RET of output terminal NO3 to an inactive state (e.g., when OUT_RET is at a high level) during power on mode in response to high voltage detection signal OVDD_RET. When the high voltage detection signal has a low level, initialization unit P3 applies the high voltage to the latch output terminal. The high voltage becomes the retention control signal having a high level to make the latch 310 in the I/O cell circuit 300 maintain a disable state at an initial stage of power on.

Figure 3:
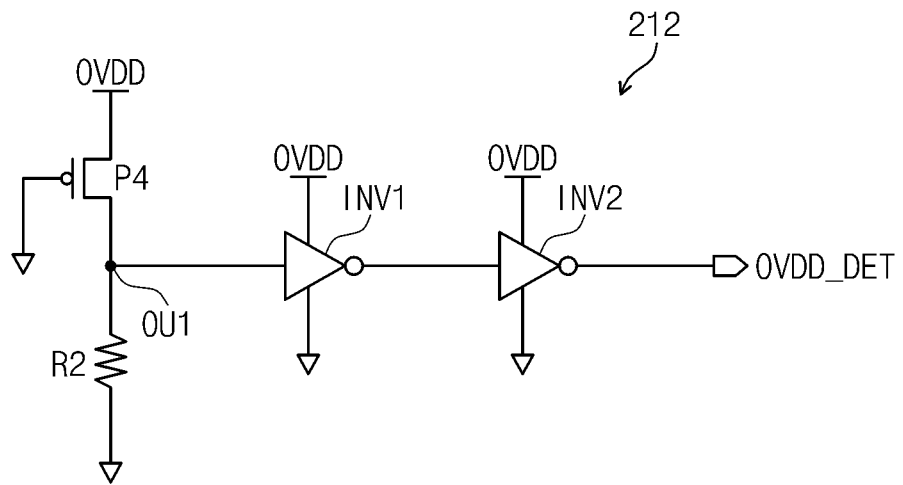
FIG. 3 shows an example of a high voltage supply detector in FIG. 2.

FIG. 3 shows an example of high voltage supply detection unit 212 in FIG. 2. As shown, the high voltage supply detection unit 212 receives the high voltage OVDD for I/O as an operation supply voltage, detects the supply of the high voltage for I/O, and generates high voltage detection signal OVDD_DET.

The high voltage supply detection unit 212 includes PMOS transistor P4 which receives the high voltage through its source and a ground voltage through its gate, a resistor R2 connected between a drain of PMOS transistor P4 and a ground, a first inverter INV1 to invert an output voltage level of drain node OUT1 of PMOS transistor P4, and a second inverter INV2 to invert an output of the first inverter INV1.

When the high voltage OVDD for I/O of high level (e.g., 3.3V) is supplied, PMOS transistor P4 is turned on. An output voltage of the drain node OU1 of the PMOS transistor P4 has a high level. When the high voltage for I/O is supplied to the high voltage supply detection unit 212, the high voltage detection signal OVDD_DET passes through the second inverter INV2 to generate a signal having a high level. The resistor R2 may have a resistance, for example, of 1 MΩ or more. (The exact value may vary depending on the particular application). As a result, leakage current flowing toward the ground can be minimized.

When the high voltage OVDD for I/O has a low level (e.g., 0V), that is, when a voltage supply is reduced or cut off, PMOS transistor P4 is turned off. An electrical potential of the drain node OU1 of PMOS transistor P4 is discharged toward the ground level and thereby an output voltage of the drain node OU1 assumes a low level. When the high voltage for I/O is not supplied to the high voltage supply detection unit 212, the high voltage detection signal OVDD_DET passes through the second inverter INV2 to generate a signal having a low level.

The high voltage supply detection unit 212 detects whether an I/O power supply is supplied or not. Also, in power-up mode in which an I/O power supply is first supplied to a chip, for example, by outputting the high voltage detection signal OVDD_DET having a low level, I/O cell circuit 300 enters a normal operation mode. That is, the I/O cell circuit 300 does perform a data retention operation in power-up operation mode.

If an I/O cell circuit (e.g., one having a programmable function) retains a data retention state in power-up mode, the output of the circuit may have unknown state in this mode. Because of this unknown state, current consumption may unnecessarily occur. However, in the present embodiment, I/O cell circuit 300 does not perform a data retention operation in power-up mode as a result of the high voltage supply detection unit 212.

Figure 4:
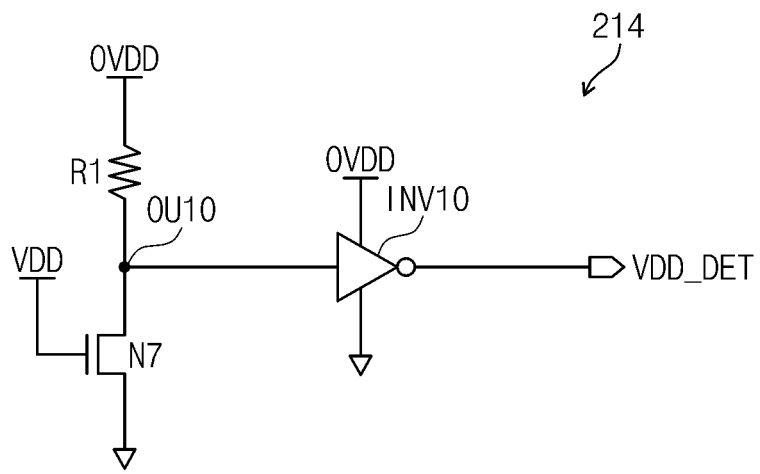
FIG. 4 shows an example of a power supply voltage supply detector of FIG. 2.

FIG. 4 shows an example of a power supply voltage supply detector 214 in FIG. 2. As shown, the power supply voltage supply detection unit 214 receives the high voltage for I/O as an operation power supply and detects a supply of the power supply voltage VDD for the logic circuit to generate power supply voltage detection signal VDD_DET.

The power supply voltage supply detection unit 214 includes a resistor R1 an NMOS transistor N7, and an inverter INV10. The resistor has one end connected to receive the high voltage OVDD. Transistor N7 has a drain-source channel connected between the other end of resistor R1 and a reference voltage (e.g., ground) and has a gate that receives the power supply voltage VDD. And, an inverter INV10 inverts an output voltage level of a drain of NMOS transistor N7.

When the power supply voltage VDD of a high level (e.g., 1.8V) is supplied, NMOS transistor N7 is turned on. An output voltage of drain node OU10 of the NMOS transistor N7 assumes a low level.

When the power supply voltage VDD is supplied to a gate of NMOS transistor N7 in the power supply voltage supply detection unit 214, the power supply voltage detection signal VDD_DET passes through inverter INV10 to generate a signal having a high level. Resistor R1 may have a resistance, for example, of 1 MΩ or more or another value depending on the application, to reduce or minimize a leakage current flowing toward the ground.

When the power supply voltage VDD of a low level (e.g., 0V) is supplied (that is, when a voltage supply is reduced or cut off), NMOS transistor N7 is turned off. An output voltage of drain node OU10 of NMOS transistor N7 assumes a high level. When power supply voltage VDD is reduced or cut off, the high voltage detection signal OVDD_DET passes through inverter INV10 to generate a signal having a low level.

In the power supply voltage supply detector 214, if the power supply voltage VDD is reduced or cut off, NMOS transistors N5 and N6 are turned off to safely retain data stored in the latch 310 of the I/O cell circuit 300 even though one or more of signals EN-RET and ENB_RET may assume a floating state.

Figure 5:
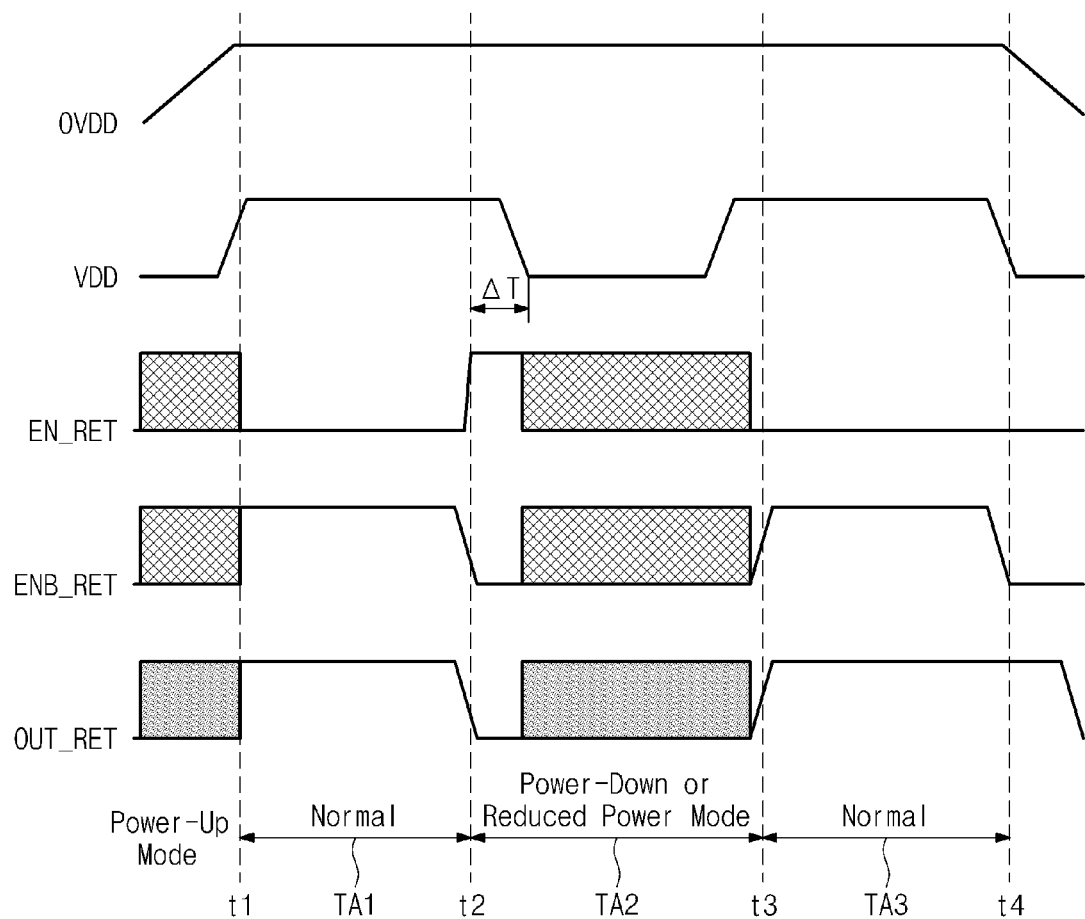
FIG. 5 shows a timing diagram for the retention control cell circuit of FIG. 2.

FIG. 5 shows one possible timing diagram for retention control cell circuit 200. In this diagram, waveform OVDD transitions between a low level (e.g., 0V) and a high level (e.g., 3.3 V). More specifically, the OVDD waveform transitions from a low level to a high level in power-up mode and this value is maintained during normal operation mode of a host chip or system. The OVDD waveform then transitions from the high level to the low level when the chip or system is to enter a data retention operation mode.

Waveform VDD transitions between a power supply voltage level (e.g., 1.8V) and a reference (e.g., 0V) level. The power supply voltage level corresponds to a power supply voltage that may be applied to logic circuit 100 during normal operation mode. The power supply voltage is not applied to logic circuit 100 in a power-down or other reduced power mode including a data retention operation mode. Also, the power supply voltage is not applied to a gate of the NMOS transistor N7 of FIG. 4. The power supply voltage of 0V is supplied in the data retention operation mode.

A waveform EN_RET represents a voltage level of the retention enable signal EN_RET. In data retention mode, the retention enable signal EN_RET assumes a high level (e.g., 1.8V) to allow the data retention operation to be performed. If, in data retention operation mode, the retention enable signal EN_RET assumes a low level, the data retention operation is not performed.

Waveform ENB_RET represents a voltage level of the retention enable bar signal ENB_RET. In data retention mode, the retention enable bar signal ENB_RET assumes a low level to allow the data retention operation to be performed. If, in data retention mode, the retention enable bar signal ENB_RET assumes a high level, the data retention operation is not performed.

Waveform OUT_RET represents a voltage level of the retention control signal OUT_RET. If the voltage level of the retention control signal OUT_RET is low, latch 310 in the I/O cell circuit 300 is enabled to latch I/O data before a power-down or other low power mode. If the voltage level of the retention control signal OUT_RET is high (e.g., 3.3V), latch 310 in the I/O cell circuit 300 is disabled not to latch I/O data.

Operation of the retention control cell circuit 200 will now be described with reference to FIGS. 2 and 5. Before normal operation mode (that is, before t1), a power-up mode is performed. In power-up mode, the OVDD waveform and the power supply voltage VDD waveform rises from a reference voltage (e.g., 0V) to 3.3V and 1.8V respectively. These waveforms may rise at different rates and at different times in the power-up mode. The rising OVDD voltage is applied to retention control cell circuit 200 and the rising power supply VDD voltage is applied to logic circuit 100.

More specifically, at the start of power-up mode, the high voltage supply detection unit 212 outputs high voltage detection signal OVDD_DET of a low level and the high voltage supply detection unit 212 outputs power supply voltage detection signal VDD_DET of a low level. Thus, an output level of the AND gate (AND1) becomes low which turns off NMOS transistors N5 and N6. Because the high voltage detection signal OVDD_DET is low at detection output node NO1, PMOS initialization transistor P3 is turned on. The retention control signal OUT_RET has a high level at latch output terminal NO3 and latch 310 of I/O cell circuit 300 is initialized to a disable state. As noted, the PMOS initialization transistor P3 is turned off when a level of the high voltage OVDD reaches, for example, 3.3 V.

In time section TA1 between t1 and t2, the circuit of FIG. 2 enters normal operation mode. Because the I/O data retention function does not need to be performed in the normal operation mode, retention enable signal EN_RET assumes a low level and retention enable bar signal ENB_RET assumes a high level during time section TA1.

In this mode, NMOS transistor N3 receives the retention enable bar signal ENB_RET of high level is turned on and NMOS transistor N5 is turned on because an output level of the AND gate is high.

That is, in normal operation mode, the AND gate receives the high voltage detection signal OVDD_DET of high level and the power supply voltage detection signal VDD_DET of high level. The input terminal NO2 of the latch unit 215 assumes a low level. Because NMOS transistor N4 receives retention enable signal EN_RET of a low level through its gate terminal, the NMOS transistor N4 is turned off.

If a level of input terminal NO2 is a low, a level of the output terminal NO3 becomes high by a PMOS transistor and an NMOS transistor constituting an inverter. Thus, latch 310 of the I/O cell circuit 300 is maintained in a disable state. In normal operation mode, retention control cell circuit 200 controls the I/O cell circuit 300 to be in an off state.

The data retention function is performed in power-down mode section TA2 before the power supply supplied to normal logic circuit 100 is cut off. At t2, the retention enable signal EN_RET assumes a high level and the retention enable bar signal ENB_RET assumes a low level in time section TA2.

NMOS transistor N4, which receives retention enable signal EN_RET of a high level through its gate, is turned on and NMOS transistor N6 is turned on because an output level of the AND gate is high. Thus, a level of latch output terminal NO3 of latch circuit 215 becomes low.

In this case, NMOS transistor N3 receives retention enable bar signal ENB_RET of a low level and turns off. If a level of latch output terminal NO3 is low, latch 310 of I/O cell circuit 300 is enabled to latch I/O data at given level. When the data retention operation latching the I/O data is completed, because the power supply voltage VDD is cut off in power-down mode, power supply voltage detection signal VDD_DET assumes a low level. Thus, an output of the AND gate goes low and NMOS transistors N5 and N6 are turned off. The retention enable signal EN_RET and retention enable bar signal ENB_RET do not affect a latch operation of the latch circuit 215 at this time.

Although one or more of the terminals that receive the retention enable signal EN_RET and retention enable bar signal ENB_RET assume a floating state in power-down mode, a level of latch output terminal NO3 does not assume an unknown level but is at a low level to perform a data retention operation. Also, leakage current through PMOS transistors P1 and P2 constituting the latch circuit 215 is reduced or cut off. In this case, I/O cell circuit 300 and retention control cell circuit 200 receive high voltage VDD as an operation voltage and latch 310 of the I/O cell circuit maintains an I/O data retention function even in the lower power (e.g., power-down or idle) mode.

Figure 6:
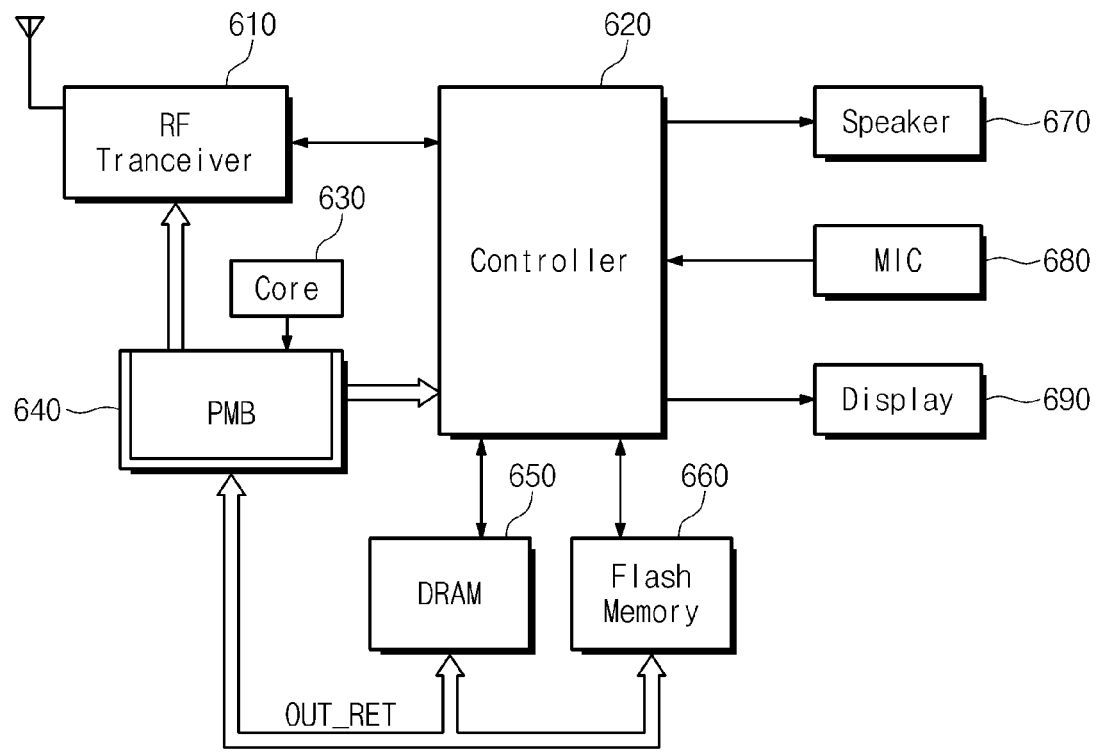
FIG. 6 shows an embodiment of a mobile application device.

FIG. 6 shows an example of how the I/O data retention device may be applied to a mobile application device, e.g., a smart phone. As shown in FIG. 6, the mobile application device may include an RF transceiver 610, a controller 620, a speaker 670, a microphone 680, a display unit 690, a DRAM 650, a flash memory 660, a core unit 630, and a power management block 640.

Before a power supply voltage to core unit 630 is cut off, a logic circuit in core unit 630 outputs the retention enable signal EN_RET at a high level and the retention enable bar signal ENB_RET at a low level. As a result, the core unit 630 is powered off.

In power-down mode of the mobile application device, power management block 640 may output retention control signal OUT_RET of a low level in response to the retention enable signal EN_RET and retention enable bar signal ENB_RET. DRAM 650 and a latch of I/O cell circuit of flash memory 660 are enabled to store I/O data.

Because retention of I/O data is performed using a logic circuit of which a power supply voltage is off in the power-down mode or idle (or reduced power) mode, the number of operative or enabled logic circuits in the device may be minimized or reduced. As a result, power saving efficiency in the power-down mode may be increased.

Also, the number of pins interfacing with the outside to receive the data retention command may be saved. If a power domain having a different I/O voltage level exists, a retention control cell circuit can be constituted by power domain. In that case, there is no need to use a level shifter when transmitting a retention control signal. As a result, a chip implementation becomes easier to realize.

While a mobile communication device is described in FIG. 6, the I/O data retention device may be applied to other types of devices. For example, the I/O data retention device may be applied to a smart card. The I/O data retention device may also be used in other types of electronic devices including but not limited to a digital versatile disc (DVD) player, a computer, a set top box (STB), a game machine, a digital camcorder, or any other device which has an active or passive power source that performs a data storage or retention function.

Other embodiments may apply to devices that have an interface connected to one or more of the aforementioned devices or mobile devices that include an application chipset, a camera image processor (CIS), a mobile DRAM, etc.

The DRAM 650 or flash memory 660 may be mounted using various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (RVSP).

In FIG. 6, a flash memory is adopted in the mobile application device but a different nonvolatile storage may be adopted. The nonvolatile storage may be embodied by an electrically erasable programmable read-only memory (EEPROM), a flash memory, a magnetic RAM (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nano floating gate memory (NFGM), a holographic memory, a molecular electronics memory device or an insulator resistance electronics memory.

Figure 7:
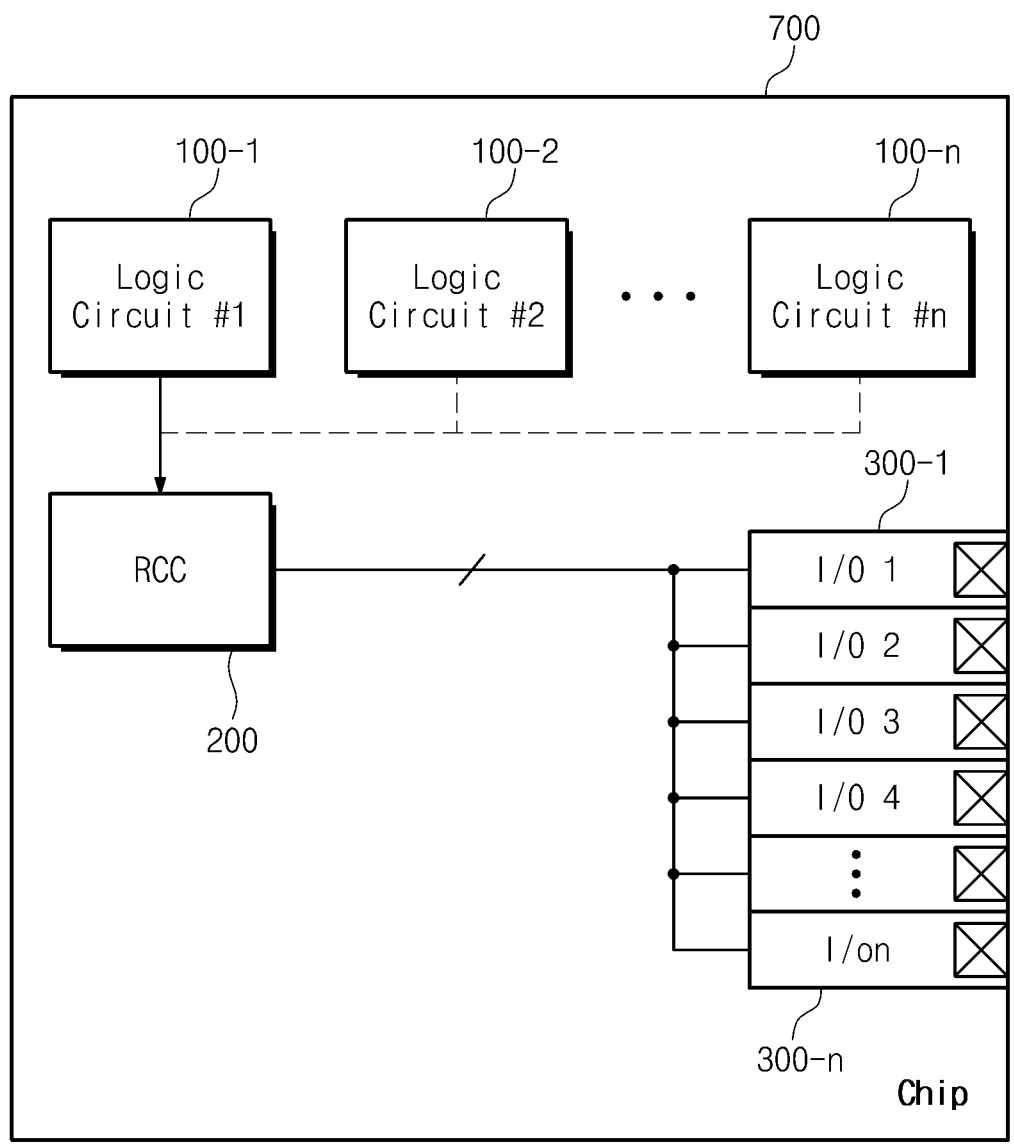
FIG. 7 shows an embodiment of an electronic device chip.

FIG. 7 shows an example of the I/O retention device applied to an electronic device chip 700 which includes a plurality of logic circuits 100-1, 100-2, . . . , 100-n), a retention control circuit (RCC) 200 and a plurality of I/O cell circuits (300-1, . . . , 300-n). The electronic device chip 700 may be, for example, a single chip.

In one application, power supplies of the plurality of logic circuits 100-1, 100-2, . . . , 100-n) may be off in power-down mode. At least one of the plurality of logic circuits 100-1, 100-2, . . . , 100-n) outputs a retention enable signal just before the power supply is off. Thus, a problem of receiving a control signal from a source outside the chip or an enabled or active logic circuit to retain an I/O output in power-down mode may be solved.

In power-down mode of electronic device chip 700, the retention control cell circuit 200 may perform the same operation as that of FIG. 2. That is, the retention control cell circuit may output a retention control signal OUT_RET in response to the retention enable signal. Accordingly, a selected circuit among the plurality of I/O cell circuits (300-1, . . . , 300-n) is stored in an internal latch.

In power-down mode of electronic device chip 700, a power supply voltage applied to the plurality of logic circuits 100-1, 100-2, . . . , 100-n) may be cut off. Because the plurality of I/O cell circuits (300-1, . . . , 300-n) and retention control cell circuit 200 receive a high voltage as an operation voltage, the plurality of I/O cell circuits (300-1, . . . , 300-n) maintain an I/O data retention function even in power-down mode. The I/O data retention function may continue to be maintained until the power supply voltage is applied to the plurality of logic circuits 100-1, 100-2, . . . , 100-n) again.

Thus, in accordance with one embodiment, I/O data retention is performed using a logic circuit of which a power supply is off in a power-down mode or idle mode. Thus, there is no need to install an external pin for data retention separately and I/O data is retained regardless of whether an alive logic exists or not inside a chip.

Figure 8:
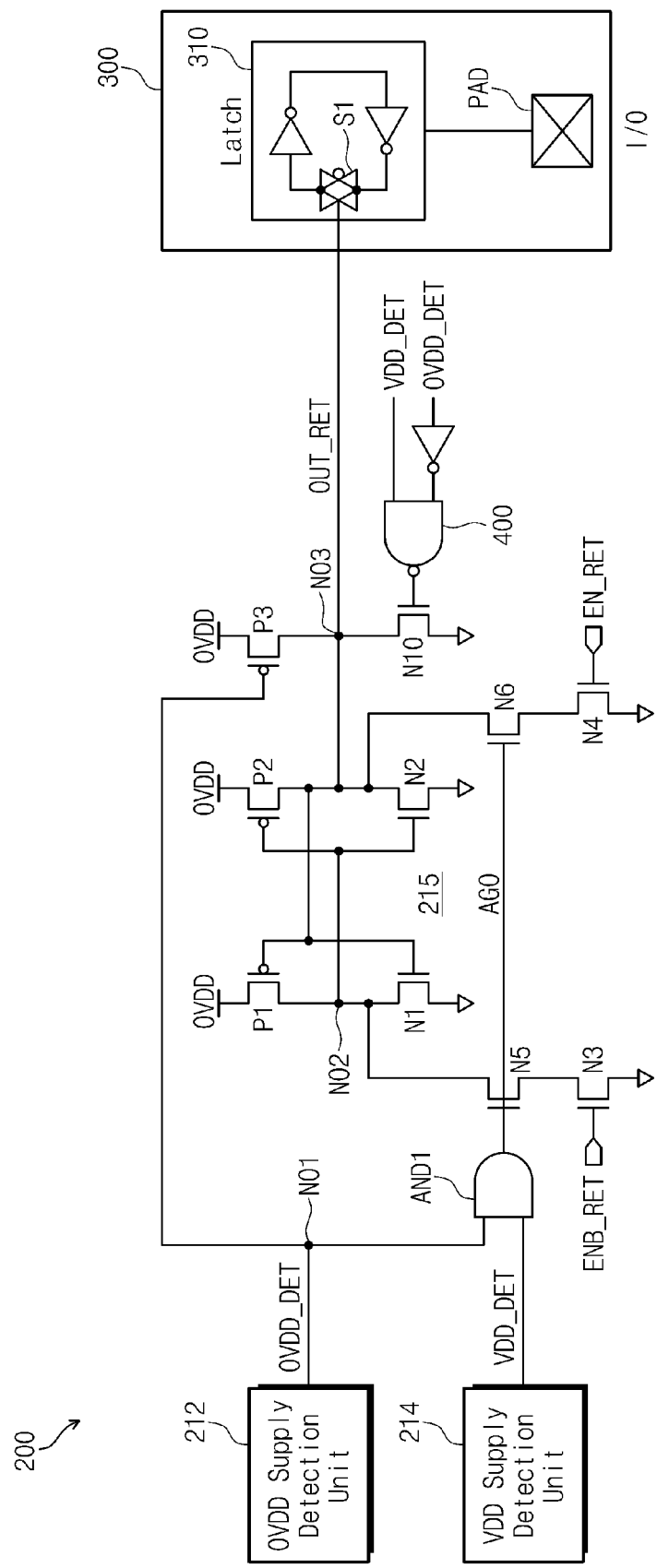
FIG. 8 shows another example of a retention control cell circuit of FIG. 1.

FIG. 8 shows another example of a retention control cell circuit of FIG. 1. This embodiment is similar to the embodiment of FIG. 2 except that an additional control circuit is provided to ensure that the logical value of node NO3 is at a low level during a reduced power mode. This additional control circuit includes a transistor N10 coupled between node NO3 and a reference potential, e.g., ground. A gate of the transistor is coupled to receive the output of a NAND gate 400, which generates an output based on a logical combination of the VDD_Det and OVDD_Det signals.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A data retention device comprising:
   a logic circuit configured to generate at least one retention enable signal before a chip enters a reduced power mode;
   a retention control cell circuit configured to latch the generated retention enable signal, and to output a retention enable control signal based on a first power signal of the logic circuit and a detection result of a second power signal for input/output (I/O); and
   an I/O cell circuit configured to latch data based on the retention enable control signal, wherein the retention control cell circuit comprises,
   a latch configured to,
      latch the generated retention enable signal, and
      output the retention enable control signal of a first level based on a level of the second power signal when a retention control operation is performed;
   a detector configured to generate a first detection signal for the first power signal of the logic circuit and a second detection signal for the second power signal for I/O;
   a controller configured to control the latch based on the first detection signal and the second detection signal; and
   an initializer configured to set the retention enable control signal to disable the retention control operation of the I/O cell circuit during a power-on mode of the chip based on the second detection signal.

2. The data retention device of claim 1, wherein the latch comprises:
   first and second transistors of a first conductivity type and first and second transistors of a second conductivity type forming an inverter-type latch; and
   third and fourth transistors of the second conductivity type respectively coupled to an input terminal and an output terminal of the inverter-type latch to receive the retention enable signal and a complementary retention enable signal.

3. The data retention device of claim 2, wherein the controller comprises:
   a gating logic configured to perform a logic operation based on logical values of the first and second detection signals;
   a fifth transistor of the second conductivity type coupled between the input terminal of the inverter-type latch and a drain of the third transistor of the second conductivity type, the fifth transistor configured to switch the retention enable signal in response to the logic operation performed by the gating logic; and
   a sixth transistor of the second conductivity type coupled between the output terminal of the inverter-type latch and a drain of the fourth transistor of the second conductivity type, the sixth transistor configure to switch the complementary retention enable signal in response to an output of the gating logic.

4. The data retention device of claim 1, wherein the initializer comprises:
   a transistor of a first conductivity type configured to generate the retention enable control signal to maintain the I/O cell circuit in a disabled state during the power-on mode of the chip based on at least the second detection signal.

5. The data retention device of claim 1, wherein the detector comprises:
   a first detector circuit configured to generate the first detection signal based on a level of the first power signal; and
   a second detector circuit configured to generate the second detection signal based on a level of the second power signal.

6. The retention device of claim 5, wherein the second detector comprises:
   a transistor of a first conductivity type having first, second and third terminals, the first terminal configured to receive the second power signal and the second terminal configured to receive a reference voltage;
   a resistor coupled between the third terminal of the transistor of the first conductivity type and a ground;
   a first inverter configured to invert an output level of the third terminal; and
   a second inverter configured to invert an output of the first inverter, 7. The data retention device of claim 5, wherein the first detector circuit comprises:
   a resistor having a first end coupled to receive the second power signal;
   a transistor having a drain-source channel coupled between a second end of the resistor and ground, the transistor having a control terminal configured to receive the first power signal; and
   an inverter configured to invert an output level of another terminal of the transistor.

8. The data retention device of claim 5, wherein the logic circuit corresponds to a mobile application device.

9. The data retention device of claim 5, wherein the logic circuit corresponds to a smart phone.

10. The data retention device of claim 5, wherein the first power signal lies in a range between a reference voltage and substantially 1.8V.

11. The data retention device of claim 5, wherein the second power signal lies in a range between a reference voltage and substantially 3.3V.

* * * * *